(12) United States Patent
Ni et al.

(10) Patent No.: US 11,626,314 B2
(45) Date of Patent: Apr. 11, 2023

(54) LIFT PIN ASSEMBLY, AN ELECTROSTATIC CHUCK AND A PROCESSING APPARATUS WHERE THE ELECTROSTATIC CHUCK IS LOCATED

(71) Applicant: Advanced Micro-Fabrication Equipment Inc. China, Shanghai (CN)

(72) Inventors: Tuqiang Ni, Shanghai (CN); Rubin Ye, Shanghai (CN); Manus Wong, Shanghai (CN); Jie Liang, Shanghai (CN); Leyi Tu, Shanghai (CN); Ziyang Wu, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 595 days.

(21) Appl. No.: 16/538,695

(22) Filed: Aug. 12, 2019

(65) Prior Publication Data

US 2020/0083087 A1    Mar. 12, 2020

(30) Foreign Application Priority Data

Sep. 12, 2018  (CN) .......................... 201811064424.9

(51) Int. Cl.
*H01L 21/68* (2006.01)
*H01L 21/687* (2006.01)
(Continued)

(52) U.S. Cl.
CPC .. *H01L 21/68742* (2013.01); *H01J 37/32513* (2013.01); *H01J 37/32724* (2013.01);
(Continued)

(58) Field of Classification Search
CPC ......... H01L 21/68742; H01L 21/67248; H01L 21/6833; H01L 21/67109; H01L 21/67126;
(Continued)

(56) References Cited

U.S. PATENT DOCUMENTS 5,539,609 A    7/1996  Collins et al.
5,761,023 A *  6/1998  Lue ..................... G03F 7/70708
                                                    361/233

(Continued)

FOREIGN PATENT DOCUMENTS

CN    101205606 A    6/2008
CN    101719480 A    6/2010
(Continued)

*Primary Examiner* — Mohammed Shamsuzzaman
(74) *Attorney, Agent, or Firm* — Womble Bond Dickinson (US) LLP

(57) ABSTRACT

Disclosed are a lift pin assembly, an electrostatic chuck with the lift pin assembly, and a processing apparatus where the electrostatic chuck is located. The lift pin assembly comprises: a lift pin, a lift pin receiving channel connected to a pressure control device, one end of the lift pin receiving channel proximal to a wafer being provided with a sealing ring, an upper surface of the sealing ring being in contact with a back face of the wafer during processing to avoid a gas at the back face of the wafer from entering the lift pin receiving channel, thereby enabling the pressure control device to independently control the pressure in the lift pin receiving channel.

10 Claims, 3 Drawing Sheets

(51) Int. Cl.
   *H01L 21/683*       (2006.01)
   *H01J 37/32*        (2006.01)
   *H01L 21/67*        (2006.01)

(52) U.S. Cl.
   CPC .. *H01J 37/32816* (2013.01); *H01L 21/67248* (2013.01); *H01L 21/6833* (2013.01)

(58) Field of Classification Search
   CPC .......... H01L 21/67253; H01L 21/6831; H01L 21/3065; H01L 21/67028; H01L 21/67069; H01L 21/67098; H01L 21/67242; H01L 21/68721; H01J 37/32513; H01J 37/32724; H01J 37/32816; H01J 37/20; H01J 37/32715; H01J 37/32174
   See application file for complete search history.

(56) References Cited

U.S. PATENT DOCUMENTS

| | | | |
|---|---|---|---|
| 6,083,344 A * | 7/2000 | Hanawa | H01J 37/32174 156/345.48 |
| 7,972,444 B2 | 7/2011 | Zucker et al. | |
| 10,340,174 B2 | 7/2019 | Yamaguchi et al. | |
| 10,475,687 B2 * | 11/2019 | Kosakai | H02N 13/00 |
| 2002/0130276 A1 | 9/2002 | Sogard | |
| 2004/0095548 A1 * | 5/2004 | Lim | G02F 1/1339 349/187 |
| 2004/0212947 A1 * | 10/2004 | Nguyen | H01L 21/67109 361/234 |
| 2007/0258184 A1 * | 11/2007 | Lee | H01L 21/68742 361/234 |
| 2008/0149032 A1 | 6/2008 | Jung | |
| 2010/0271744 A1 * | 10/2010 | Ni | H01L 22/14 361/233 |
| 2015/0165492 A1 * | 6/2015 | Avoyan | B08B 17/04 137/15.01 |
| 2017/0140970 A1 * | 5/2017 | Boyd, Jr. | H01L 21/6875 |
| 2017/0352565 A1 | 12/2017 | Zhang et al. | |
| 2019/0088518 A1 * | 3/2019 | Koh | C23C 16/505 |
| 2019/0206703 A1 * | 7/2019 | Zhao | H05H 1/46 |
| 2019/0267218 A1 * | 8/2019 | Wang | H01L 21/6831 |

FOREIGN PATENT DOCUMENTS

| | | | | |
|---|---|---|---|---|
| JP | 2015023041 A | 2/2015 | | |
| KR | 20090005409 U | 6/2009 | | |
| KR | 20100108323 A | 10/2010 | | |
| KR | 20140094475 A | 7/2014 | | |
| WO | WO-2017126534 A1 * | 7/2017 | ....... | H01L 21/67103 |

* cited by examiner

LIFT PIN ASSEMBLY, AN ELECTROSTATIC CHUCK AND A PROCESSING APPARATUS WHERE THE ELECTROSTATIC CHUCK IS LOCATED

RELATED APPLICATION

The present application claims priority to and the benefit of Chinese Patent Application No. 201811064424.9, filed on Sep. 12, 2018, and the disclosure of which is hereby incorporated herein by reference in its entirety.

FIELD

Embodiments of the present disclosure relate to the field of plasma etching, and more particularly relate to the field of plasma processing which prevents arc generation in an electrostatic chuck under a high RF power.

BACKGROUND

Micro fabrication of a semiconductor wafer or substrate is a known technology for fabricating such as a semiconductor, a flat-panel display, a light-emitting diode (LED), and a solar cell, etc. Plasma processing, as an important step in micro fabrication, is performed in a reaction chamber into which a process gas is delivered. A radio frequency (RF) source is inductively and/or capacitively coupled to the inside of the reaction chamber to excite the process gas so as to form and maintain the plasma. In the reaction chamber, the exposed wafer is supported by an electrostatic chuck and is fixed at a fixed position by a certain chucking force so as to guarantee the safety of the wafer and a high yield of the processing during the fabrication process.

To meet process requirements, it is needed to strictly control the fabrication process as well as semiconductor wafer loading and de-chucking. Semiconductor wafer loading and de-chucking are key steps for semiconductor wafer processing. By providing a plurality of lift pin assemblies in the electrostatic chuck, upon completion of the fabrication process, de-chucking and lifting of the wafer with respect to the electrostatic chuck is enabled with a support force of the lift pins, wherein a robot hand outside the reaction chamber extends between the wafer and the electrostatic chuck to implement removal of the wafer.

During the wafer fabrication process, besides supporting and fixing the wafer, the electrostatic chuck may also function to control a temperature of the wafer; with an increasing demand on wafer processing precision, the requirement on temperature uniformity control of the electrostatic chuck also becomes increasingly higher. Temperature control of the electrostatic chuck includes heating and cooling. A conventional cooling technology in current use is to introduce a cooling gas (e.g., helium) between the wafer and the electrostatic chuck. By introducing helium into a lift pin receiving channel, uniform dispersion of the helium between the wafer and the electrostatic chuck implements uniform cooling to the wafer.

With increase of the RF power applied to the reaction chamber, such a cooling technology easily causes electric discharge of the cooling gas in a lift pin receiving channel, which seriously threatens the operation stability and safety of the electrostatic chuck. Therefore, there is an urgent need for a solution which is adapted to the constant rise of the applied RF power and meets the wafer processing uniformity requirement.

SUMMARY

To solve the technical problem above, the present disclosure provides a lift pin assembly disposed in an electrostatic chuck, the lift pin assembly being configured for implementing de-chucking and lifting of a wafer with respect to a surface of the electrostatic chuck upon completion of a fabrication process, the lift pin assembly comprising: a lift pin; a lift pin receiving channel, one end of the lift pin receiving channel proximal to the wafer being provided with a sealing ring, an upper surface of the sealing ring being in contact with a back face of the wafer during the fabrication process to avoid a gas at the back face of the wafer from entering the lift pin receiving channel; and a pressure control device connected to the lift pin receiving channel, for independently controlling a gas pressure in the lift pin receiving channel.

Further, the sealing ring is a projecting portion disposed on an upper surface of the electrostatic chuck, the upper surface of the projecting portion being higher than the upper surface of the electrostatic chuck.

Further, the sealing ring is integrally formed with the electrostatic chuck.

Further, the pressure control device comprises a gas admittance valve, a gas discharge valve, and a pressure measurement device.

Further, the lift pin receiving channel is connected to a cooling gas source, the cooling gas source controlling, via the gas admittance valve, a flow rate of the cooling gas entering the lift pin receiving channel.

Further, the lift pin receiving channel is connected to a gas discharge region via the gas discharge valve.

Further, the pressure measurement device may measure and display the gas pressure in the lift pin receiving channel.

Further, the pressure measurement device is a pressure controller.

The present disclosure further provides an electrostatic chuck for supporting and fixing a wafer during a fabrication process, the electrostatic chuck comprising: a cooling gas delivery channel connected to a first cooling gas source via a first pressure control device; a lift pin assembly comprising a lift pin and a lift pin receiving channel, the lift pin including a support end proximal to the wafer; and a second pressure control device connected to the lift pin receiving channel, configured for independently controlling a gas pressure in the lift pin receiving channel.

Further, the lift pin receiving channel comprises a sealing ring, the sealing ring being arranged proximal to a back face of the wafer, an upper surface of the sealing ring being in contact with the back face of the wafer during the fabrication process to avoid a gas at the back face of the wafer from entering the lift pin receiving channel.

Further, the sealing ring is a projecting portion disposed on an upper surface of the electrostatic chuck, the upper surface of the projecting portion being higher than the upper surface of the electrostatic chuck.

Further, the sealing ring is integrally formed with the electrostatic chuck.

Further, the second pressure control device comprises a gas admittance valve, a gas discharge valve, and a pressure measurement device.

Further, the lift pin receiving channel is connected to a second cooling gas source, the second cooling gas source controlling, via the gas admittance valve, a flow rate of the cooling gas entering the lift pin receiving channel.

Further, the lift pin receiving channel is connected to a gas discharge region via the gas discharge valve.

Further, a flow-limiting device is in parallel connection with the gas discharge valve, the flow-limiting device including a flow-limiting valve and/or a flow-limiting hole.

Further, the pressure measurement device may measure and display the gas pressure in the lift pin receiving channel.

Further, the pressure measurement device is a pressure controller.

Further, the first pressure control device comprises a gas admittance valve, a gas discharge valve, and a pressure measurement device.

Further, a diameter of the support end of the lift pin is greater than a diameter of an opening of the lift pin receiving channel, such that the support end covers the opening of the lift pin receiving channel during the fabrication process, thereby avoiding the cooling gas at the back face of the wafer from entering the lift pin receiving channel.

The present disclosure further provides a plasma processing apparatus, comprising a reaction chamber in which the electrostatic chuck as mentioned above is disposed.

The present disclosure further provides a method for processing a wafer, the method being performed in a reaction chamber of a plasma processing apparatus, the method comprising steps of: transferring a to-be-processed wafer into the reaction chamber, and fixing the to-be-processed wafer above an electrostatic chuck; applying an RF power into the reaction chamber and simultaneously supplying a reactant gas into the reaction chamber, the reactant gas being deionized into plasma under an action of the RF power, and then performing plasma processing to the wafer; while processing the wafer with the plasma, delivering respectively a cooling gas separately to a cooling gas delivery channel and a lift pin receiving channel in the electrostatic chuck; providing a first pressure control device for independently controlling a pressure of the cooling gas in the cooling gas delivery channel; providing a second pressure control device for independently controlling a pressure of the cooling gas in the lift pin receiving channel; calculating or measuring, a critical value, as a safety pressure value, at which the cooling gas in the lift pin receiving channel is ignited based on a magnitude of the RF power applied into the reaction chamber, wherein the second pressure control device controls the pressure of the cooling gas in the pin lift receiving channel to be always lower than the safety pressure value.

Further, a sealing part is arranged between the lift pin receiving channel and the wafer, and the pressure control device controls the pressure of the cooling gas in the lift pin receiving channel to be greater than or equal to 0.

Further, after completion of wafer processing, the wafer is removed, and the second pressure control device continuously delivers the cooling gas into the lift pin receiving channel to implement purging a side wall of the lift pin receiving channel.

The present disclosure provides a technical solution of supplying a cooling gas to a back face of a wafer; by arranging a channel specific for delivering the cooling gas in the electrostatic chuck and by delivering the cooling gas using a lift pin assembly, a design of two ways of separately controlling the flow rate of the gas is implemented, which may not only guarantee sufficient supply of the cooling gas, but also may lower the pressure of the cooling gas in the lift pin receiving channel, and simultaneously does not affect the wafer cooling effect in the region corresponding to the opening of the lift pin receiving channel. Implementation of adjustability of the pressure in the lift pin receiving channel allows the reaction chamber to endure a RF power source with a higher power, such that arc discharge does not occur in the electrostatic chuck. Besides, by arranging a sealing part (e.g., a sealing ring) at one end of the lift pin receiving channel proximal to the wafer or by increasing the area of the support end of the lift pin, the cooling gas at the back face of the wafer may be prevented from entering the lift pin receiving channel, which improves the adjustability of the pressure in the lift pin receiving channel.

BRIEF DESCRIPTION OF THE DRAWINGS

To elucidate the technical solutions of the present disclosure or the prior art, the drawings used in describing the embodiments of the present disclosure or the prior art will be briefly introduced below. It is apparent that the drawings as described only relate to some embodiments of the present disclosure. To those skilled in the art, other drawings may be derived based on these drawings without exercise of inventive work, wherein.

DETAILED DESCRIPTION OF EMBODIMENTS

To clarify the objects, technical solutions, and advantages of the embodiments of the present disclosure, the technical solutions in the embodiments of the present disclosure will be described clearly and comprehensively with reference to the accompanying drawings of the embodiments of the present disclosure; apparently, the embodiments as described are only part of the embodiments of the present disclosure, rather than all of them. All other embodiments obtained by those skilled in the art without performing inventive activities based on the examples in the embodiments all fall within the protection scope of the present disclosure.

Figure 1:
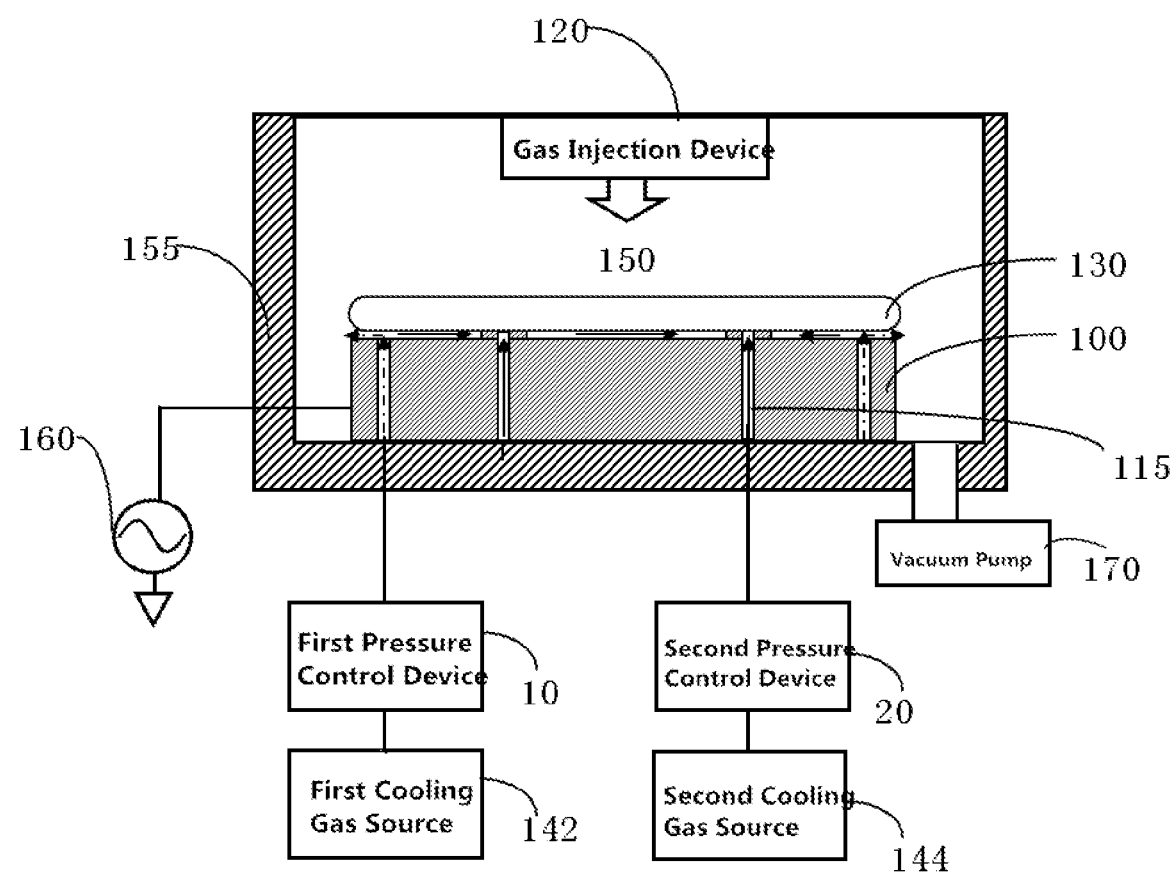
FIG. 1 shows a plasma processing apparatus.

FIG. 1 shows a plasma processing apparatus, comprising a vacuum reaction chamber 150 enclosed by an outer wall 155. The reaction chamber 150 is configured for processing the wafer. An electrostatic chuck 100 is arranged at a bottom portion of the reaction chamber, for supporting and fixing the wafer 130. A gas injection device 130 injects a reactant gas into the reaction chamber 150; under excitation of a RF power source 160, the reactant gas is deionized into plasma and maintained so as to implement plasma processing to the wafer. The vacuum pump 170 may vacuumize the reaction chamber so as to guarantee plasma processing to the wafer in a vacuum environment.

During the wafer processing procedure, plasma bombardment to the wafer causes the wafer heated, raising the temperature. To guarantee the temperature uniformity and processing stability across different regions of the wafer, a design for uniformly cooling the wafer is desired on the electrostatic chuck. A conventional practice in the industry is delivering a cooling gas (e.g., helium) to the back face of the wafer, where uniform dispersion of the cooling gas at the back face of the wafer implements uniform cooling of the wafer.

A method of delivering a cooling gas is performed using a lift pin assembly within the electrostatic chuck. The lift pin assembly comprises a lift pin 115 and a lift pin receiving channel. The lift pin functions to implement, upon completion of a wafer fabrication process, separation of the wafer 130 from the electrostatic chuck 100 by lifting of the lift pin; after the wafer 130 is lifted to a certain height, a robot arm outside the reaction chamber takes over the wafer, thereby implementing removal of the wafer from the reaction chamber. The lift pin receiving channel is configured for receiving the lift pin. To implement temperature control of of the wafer, a cooling gas source is communicated to the lift pin receiving channel, such that a certain flow rate of the cooling gas is delivered between the wafer 130 and the electrostatic chuck 100 via the lift pin receiving channel dependent on process requirements.

With constant evolution of the integrated circuit industry, it becomes increasingly demanding on semiconductor wafer processing precision. To improve processing precision, the power of the RF power source applied into the reaction chamber constantly increases. To guarantee a wafer cooling effect, the cooling gas with a certain pressure needs to be delivered to the lift pin receiving channel; with increase of the RF power applied into the reaction chamber, the odds of igniting the cooling gas in the lift pin receiving channel into plasma also increases. The phenomenon of the cooling gas being ignited into plasma is also referred to as an arc discharge phenomenon. Arc discharge of the cooling gas in the lift pin receiving channel will damage the components in the reaction chamber and cause a series of risky consequences, which should be absolutely avoided.

Figure 2:
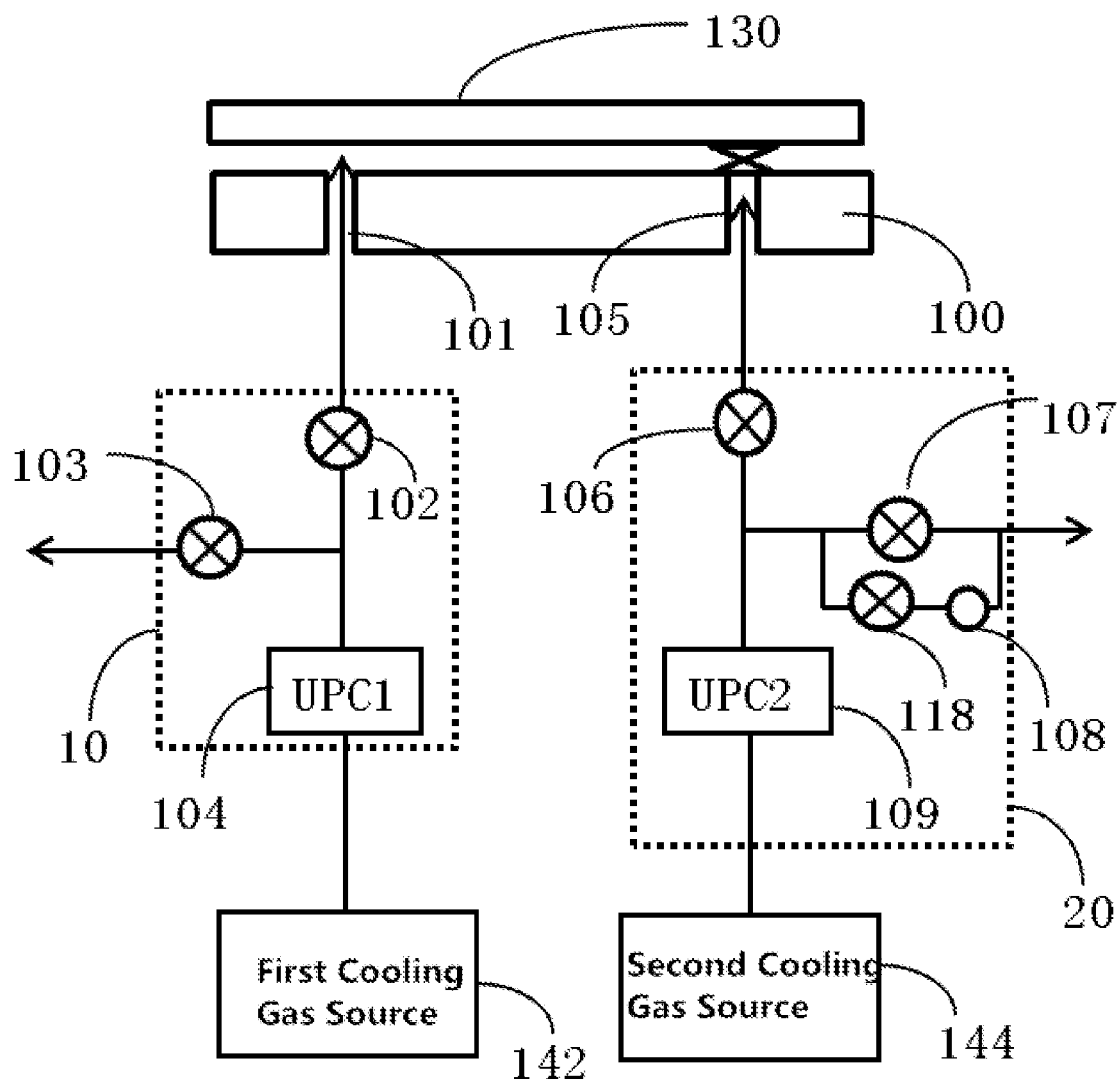
FIG. 2 shows a structural schematic diagram of a cooling gas supplying system.

FIG. 2 discloses a schematic diagram of a cooling gas supply system according to the present disclosure. A lift pin receiving channel 105 is configured for receiving a lift pin 115; the lift pin should have a certain mechanical strength and stability to implement lifting of the wafer, such that it cannot be too slim; besides, a certain gap should be guaranteed between the lift pin and a side wall of the lift pin receiving channel 105, such that the size of the lift pin receiving channel cannot be too small. Studies show that the arc discharge phenomenon occurring to the cooling gas is associated with the size of a container for the cooling gas and the gas pressure in the container; the larger the container size is or the higher the gas pressure in the container is, the more easily the arc discharge phenomenon occurs to the gas. The present disclosure may be adapted to the constantly increasing RF power by reducing the gas pressure in the case that the container size cannot be reduced.

However, rash reduction of the pressure of the cooling gas in the lift pin receiving channel 105 will deteriorate the wafer cooling effect. Therefore, to solve this problem, the present disclosure arranges a set of cooling gas delivery channel 101 specific for delivering a cooling gas in the electrostatic chuck 100. The cooling gas delivery channel 101 communicates with a first cooling gas source 142 via a first pressure control device 10 which can control, measure, and display the pressure in the cooling gas delivery channel 101. The first pressure control device 10 comprises a gas admittance valve 102, a gas discharge valve 103, and a pressure measurement device 104, and can deliver the cooling gas with a certain pressure into the cooling gas delivery channel 101 based on a control instruction of the controller (not shown). Preferably, the pressure measurement device 104 is a pressure controller (UPC1). As no lift pins are provided in the cooling gas delivery channel 101, the cooling gas delivery channel 101 can be arranged with an opening of a relatively small size, e.g., less than 1 millimeter. Since the causes for igniting the gas into plasma by the RF power are related to gas pressure and gas container size, the small size of the cooling gas delivery channel 101 does not easily trigger an arc discharge phenomenon even a higher pressure of the cooling gas is delivered thereinto. Therefore, sufficient cooling gas may be safely delivered to the back face of the wafer according to process needs.

To implement pressure adjustment in the cooling gas delivery channel 101, a gas admittance valve 102 is arranged between the cooling gas delivery channel 101 and a first cooling gas source 142, and a gas discharge valve 103 is arranged between the cooling gas delivery channel 101 and the gas discharge region, such that when it is needed to deliver the cooling gas to the back face of the wafer, the gas admittance valve 102 is opened, the gas discharge valve 103 is closed, and then the UPC1 104 delivers the needed cooling gas to the back face of the wafer according to an instruction of the controller. Upon completion of the fabrication process, the gas admittance valve 102 is closed, and the gas discharge valve 103 is opened, thereby discharging the cooling gas in the cooling gas delivery channel 101.

Although the channel 101 specific for delivering the cooling gas has been arranged in the electrostatic chuck 100, it is still essential to introduce the cooling gas in the lift pin receiving channel 105. First, introducing the cooling gas into the lift pin receiving channel 105 may compensate for cooling of the wafer at the corresponding region above the channel; for a process that is highly demanding on wafer processing uniformity, it is required to guarantee temperature uniformity across all regions of the wafer. Second, introducing the cooling gas into the lift pin receiving channel 105 may implement purging of the channel, which avoids aggregation of reaction byproducts in the channel. Meanwhile, to avoid the cooling gas in the lift pin receiving channel 105 from being ignited into plasma, it is essential to perform an effective independent control of the gas pressure in the lift pin receiving channel 105.

In the present disclosure, the lift pin receiving channel 105 is connected to a second cooling gas source 144 via a second pressure control device 20, wherein the first cooling gas source 142 and the second cooling gas source 144 may be identical or different. The second pressure control device comprises a gas admittance valve 106, a gas discharge valve 107, and a pressure measurement device 109. A gas admittance valve 106 is connected between the lift pin receiving channel 105 and the second cooling gas source 144, and a gas discharge valve 107 is connected between the lift pin receiving channel 105 and the discharge region. To guarantee precise control of the gas in the lift pin receiving channel 105, a flow-limiting device in parallel connection with the gas discharge valve 107 is provided. The pressure measurement device 109 is in communication with the lift pin receiving channel 105; the pressure control device 20 may measure and display the pressure in the lift pin receiving channel 105 and may receive a control instruction from a controller (not shown) to deliver a cooling gas with a certain pressure to the lift pin receiving channel 105. Preferably, the pressure measurement device 109 is a pressure controller (UPC2). Prior to the fabrication process, a safety pressure value can be calculated or tested based on the magnitude of the applied RF power and the size of the lift pin receiving channel 105. The safety pressure value can guarantee that under this RF power, an arc discharge phenomenon will not occur to the cooling gas in the lift pin receiving channel. As the UPC2 can measure and display the pressure in the lift pin receiving channel 105, when the pressure in the lift pin receiving channel 105 is lower than the safe pressure value, to guarantee a wafer cooling effect, the gas admittance valve 106 may be opened and the gas discharge valve 107 may be closed to thereby increase the pressure of the cooling gas in the lift pin receiving channel 105. When the UPC2 displays that the pressure of the cooling gas in the lift pin receiving channel 105 reaches or exceeds the safe pressure value, the gas admittance valve 106 is closed, and the gas discharge valve 107 is opened, to thereby reduce the pressure of the cooling gas in the lift pin receiving channel 105. To guarantee that the pressure of the cooling gas in the lift pin receiving channel 105 does not exceed the safe pressure value, a flow-limiting device can be arranged at a gas discharge path. The flow-limiting device comprises a flow-limiting valve 118 and a flow-limiting hole 108. When the gas admittance valve 106 is opened to introduce the cooling gas into the lift pin receiving channel 105, to avoid the pressure in the channel from exceeding the safe pressure value, the flow-limiting valve 118 may be opened such that the cooling gas may be continuously discharged to the external via the flow-limiting hole 108, thereby implementing dynamic fine-tuning of the pressure in the channel 105.

The technical solution of the present disclosure enables separate control of the gas pressure in the cooling gas delivery channel 101 and the gas pressure in the lift pin receiving channel 105, which not only guarantees sufficient supply of the cooling gas required by the fabrication process, but also reduces the pressure of the cooling gas in the lift pin receiving channel 105, such that the pressure of the cooling gas in the lift pin receiving channel 105 can be adjusted based on the magnitude of the RF power applied to the reaction chamber, which ensures that the cooling gas in the lift pin receiving channel 105 is in a safe range where the arc discharge does not occur.

To guarantee free dispersion of the cooling gas, a certain gap needs to be arranged between the back face of the wafer and the electrostatic chuck 100. Therefore, the cooling gas in the lift pin receiving channel 105 includes the cooling gas directly introduced via the gas admittance valve 106 from the cooling gas source 144, and also includes the cooling gas provided from the cooling gas delivery channel 101 and flowing in via the gap at the back face of the wafer, which causes the pressure of the cooling gas in the lift pin receiving channel 105 difficult to control, such that the gas pressure easily exceeds the safe pressure value, posing a risk of ionizing the cooling gas in the lift pin receiving channel 105. To avoid that issue, the present disclosure preferably arranges a sealing part 110 at one end of the lift pin receiving channel 105 proximal to the back face of the wafer.

Figure 3:
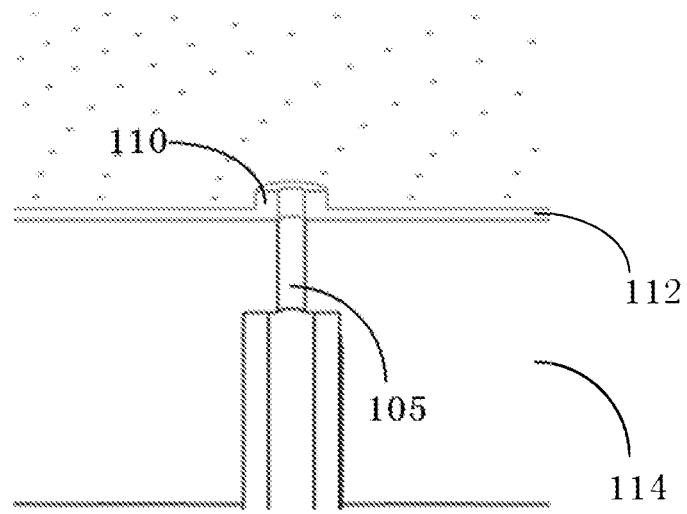
FIG. 3 shows a structural schematic diagram of a lift pin assembly.

FIG. 3 shows a structural schematic diagram of a lift pin assembly inside an electrostatic chuck 100. In this embodiment, a sealing part 110 is arranged at one end of the lift pin receiving channel 105 proximal to the back face of the wafer; the sealing part is a projecting portion slightly higher than an upper surface of the electrostatic chuck 100. During the wafer fabrication process, the upper surface of the sealing part is in contact with the back face of the wafer, such that a gas inlet port at one end of the lift pin receiving channel 105 proximal to the back face of the wafer is sealed, thereby guaranteeing that the cooling gas in the lift pin receiving channel 105 is all introduced via the gas admittance valve 106, and thereby improving the controllability of the gas pressure in the channel.

The sealing part may be integrally formed with the electrostatic chuck 100 or may be separately formed and then fixed onto the upper surface of the electrostatic chuck 100. FIG. 3 shows a schematic diagram of an electrostatic chuck provided with a sealing part. For the sake of clear illustration, a ratio between the height of the sealing part 110 and the thickness of the electrostatic chuck 100 has been modified. In this embodiment, an electrostatic chuck clamping layer 112 is disposed above a base 114, and the lift pin assembly is arranged to penetrate through the electrostatic chuck and the base. To prevent the cooling gas from flowing into the lift pin receiving channel 105 from the side wall of the sealing ring, the sealing part needs to have a continuous sealed structure. Obviously, besides a circular shape, the sealing part may also have an oval shape, a square shape, or other continuous shape, preferably be a sealing ring. The electrostatic chuck is generally provided with a plurality of sets of lift pin assemblies. For example, three or above sets of lift pin assemblies may be arranged. To guarantee the stability of the wafer, the heights of the sealing parts on the plurality of sets of lift pin assemblies need to be completely uniform.

Figure 4:
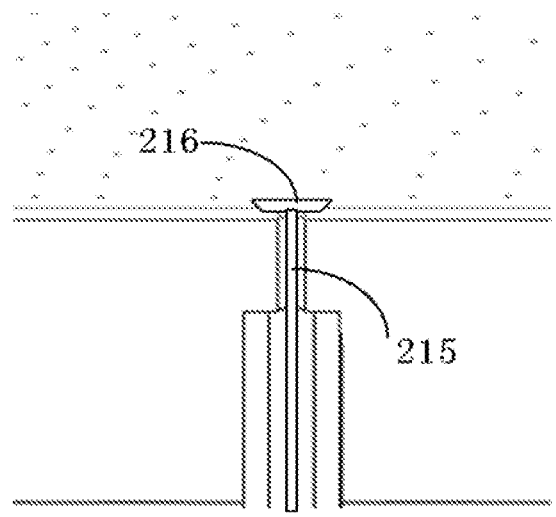
FIG. 4 shows a structural schematic diagram of another lift pin assembly.

To prevent the cooling gas at the back face of the wafer from flowing into the lift pin receiving channel, which would otherwise affect pressure adjustment and control of the gas in the channel, a sealing part may be further provided on the lift pin, as shown in FIG. 4. One end of the lift pin proximal to the wafer is referred to as a support end; after completion of the fabrication process, the lift pin is driven to rise, causing the support end to be in contact with the wafer to lift the wafer, thereby implementing de-chucking of the wafer from the electrostatic chuck. A contact face between the support end of the lift pin and the wafer is usually of a dot shape or a circular shape. In this embodiment, a diameter of an upper end face of the support end 216 of the lift pin 215 is arranged to be larger than or equal to a diameter of the opening of the lift pin receiving channel; during the fabrication process, the lift pin descends, and the support end 216 covers the opening of the lift pin receiving channel to thereby implement sealing of the opening of the lift pin receiving channel. This avoids the cooling gas at the back face of the wafer from flowing into the lift pin receiving channel and guarantees controllability of the gas pressure in the lift pin receiving channel. Meanwhile, increasing the size of the support end face of the lift pin facilitates enhancing the lifting stability of the lift pin.

In an alternative embodiment, to completely prevent occurrence of the arc discharge phenomenon in the lift pin receiving channel 105, delivery of the cooling gas into the lift pin receiving channel 105 may be suspended during the fabrication process. As a sealing part is provided on the opening of the lift pin receiving channel 105, the cooling gas from the back face of the wafer cannot enter the lift pin receiving channel 105; as such, the gas pressure in the lift pin receiving channel 105 may be maintained at a relatively low state, such that it is definitely impossible for occurrence of the arc discharge phenomenon. Upon completion of the fabrication process, the wafer 130 is removed, and the gas admittance valve 106 is opened, such that the cooling gas may purge the side wall of the lift pin receiving channel 105.

The present disclosure provides a technical solution of supplying a cooling gas to a back face of a wafer; by arranging, inside the electrostatic chuck, a channel specific for delivering the cooling gas and by delivering the cooling gas using a lift pin assembly, a design of separately controlling the flow rate of the gas is implemented, which may not only guarantee sufficient supply of the cooling gas, but also may lower the pressure of the cooling gas in the lift pin receiving channel, and simultaneously does not affect the wafer cooling effect in the region corresponding to the opening of the lift pin receiving channel. Implementation of adjustability of the pressure in the lift pin receiving channel allows the reaction chamber to endure a RF power source with a higher power, such that arc discharge does not occur in the electrostatic chuck. Besides, by arranging a sealing part (e.g., a sealing ring) at one end of the lift pin receiving channel proximal to the wafer or by increasing the area of the support end of the lift pin, the cooling gas at the back face of the wafer may be prevented from entering the lift pin receiving channel, which would otherwise affect control and adjustment of the pressure in the lift pin receiving channel.

Although the contents of the present disclosure have been described in detail through the foregoing preferred embodiments, it should be understood that the depictions above shall not be regarded as limitations to the present disclosure. After those skilled in the art having read the contents above, many modifications and substitutions to the present disclosure are all obvious. Therefore, the protection scope of the present disclosure should be limited by the appended claims.

We claim:

1. An electrostatic chuck for supporting and fixing a wafer during a fabrication process, the electrostatic chuck comprising:
    a cooling gas delivery channel within the electrostatic chuck and connected to a first cooling gas source via a first pressure control device, the first pressure control device controlling the cooling gas delivery to a back face of the wafer;
    a lift pin assembly disposed in the electrostatic chuck, the lift pin assembly being configured for implementing de-chucking and lifting of the wafer with respect to an upper surface of the electrostatic chuck upon completion of a fabrication process, the lift pin assembly comprising:
    a lift pin;
    a lift pin receiving channel within the electrostatic chuck;
    a sealing ring provided at one end of the lift pin receiving channel at the upper surface of the electrostatic chuck proximal to the back face of the wafer, an upper surface of the sealing ring being in contact with the back face of the wafer during the fabrication process;
    a second pressure control device connected to the lift pin receiving channel, configured for controlling a gas pressure in the lift pin receiving channel independently of the first pressure control device;
    wherein the sealing ring is a projecting portion disposed on the upper surface of the electrostatic chuck, the upper surface of the projecting portion being higher than the upper surface of the electrostatic chuck.

2. The electrostatic chuck according to claim 1, wherein the sealing ring is integrally formed with the electrostatic chuck.

3. The electrostatic chuck according to claim 1, wherein the second pressure control device comprises a gas admittance valve, a gas discharge valve, and a pressure measurement device.

4. The electrostatic chuck according to claim 3, wherein the lift pin receiving channel is connected to a second cooling gas source, the second cooling gas source controlling, via the gas admittance valve, a flow rate of the cooling gas entering the lift pin receiving channel.

5. The electrostatic chuck according to claim 3, wherein the lift pin receiving channel is connected to a gas discharge region via the gas discharge valve.

6. The electrostatic chuck according to claim 5, wherein a flow-limiting device is in parallel connection with the gas discharge valve, the flow-limiting device including a flow-limiting valve and/or a flow-limiting hole.

7. The electrostatic chuck according to claim 3, wherein the pressure measurement device measures and displays the gas pressure in the lift pin receiving channel.

8. The electrostatic chuck according to claim 1, wherein the first pressure control device comprises a gas admittance valve, a gas discharge valve, and a pressure measurement device.

9. The electrostatic chuck according to claim 1, wherein a diameter of the support end of the lift pin is greater than a diameter of an opening of the lift pin receiving channel, such that the support end covers the opening of the lift pin receiving channel during the fabrication process, thereby avoiding the cooling gas at the back face of the wafer from entering the lift pin receiving channel.

10. A plasma processing apparatus, comprising a reaction chamber in which the electrostatic chuck according to claim 1 is disposed.

* * * * *